United States Patent
Horikoshi et al.

(10) Patent No.: US 7,898,264 B2
(45) Date of Patent: Mar. 1, 2011

(54) MOTOR INSULATION DETERIORATION DETECTION DEVICE

(75) Inventors: Shinichi Horikoshi, Minamitsuru-gun (JP); Hiroyasu Sato, Minamitsuru-gun (JP); Akira Hirai, Minamitsuru-gun (JP)

(73) Assignee: Fanuc Ltd, Minamitsuru-gun, Yamanashi (JP)

( * ) Notice: Subject to any disclaimer, the term of this patent is extended or adjusted under 35 U.S.C. 154(b) by 0 days.

(21) Appl. No.: 12/623,920

(22) Filed: Nov. 23, 2009

(65) Prior Publication Data

US 2010/0171511 A1 Jul. 8, 2010

(30) Foreign Application Priority Data

Jan. 5, 2009 (JP) .............................. 2009-000395

(51) Int. Cl.
*G01R 31/02* (2006.01)
(52) U.S. Cl. ...................................... 324/551; 324/547
(58) Field of Classification Search ................. 324/551, 324/547, 772
See application file for complete search history.

(56) References Cited

U.S. PATENT DOCUMENTS 7,253,639 B2    8/2007  Horikoshi et al.
2006/0022679 A1*  2/2006  Obata et al. .................. 324/551
2006/0158197 A1*  7/2006  Horikoshi et al. ........... 324/551
2008/0094022 A1   4/2008  Horikoshi et al.
2008/0150549 A1   6/2008  Horikoshi et al.

FOREIGN PATENT DOCUMENTS

JP  2006-226993  8/2006
JP  2008-102096  5/2008
JP  2008-157672  7/2008

OTHER PUBLICATIONS

Japanese Notice of Reasons for Rejection mailed Apr. 27, 2010 issued in Japanese Application No. 2008-320088.

* cited by examiner

*Primary Examiner*—Vincent Q Nguyen
(74) *Attorney, Agent, or Firm*—Drinker Biddle & Reath LLP

(57) ABSTRACT

Disclosed is an insulation deterioration detection device that can accurately detect insulation deterioration in multiple motors by a simple circuit configuration. When detecting insulation deterioration, one end A of a smoothing capacitor is connected via a first switch to ground, and the other end B is connected via a second switch to motor windings; in this condition, link voltage is measured by a voltage measuring circuit provided in a converter unit, and the measured link voltage value is transmitted to a microcomputer in each inverter unit via serial communication. Current flowing via motor insulation resistance $Z_1$, $Z_2$ is measured by a current measuring circuit provided in each inverter unit, and the microcomputer calculates the value of the insulation resistance $Z_1$, $Z_2$ from the link voltage value and the current value.

1 Claim, 2 Drawing Sheets

MOTOR INSULATION DETERIORATION DETECTION DEVICE

This application claims priority to Japanese Patent Application No. 2009-000395 filed Jan. 5, 2009.

BACKGROUND OF THE INVENTION

1. Field of the Invention

The present invention relates to a device for detecting insulation deterioration in a plurality of motors connected to a motor driving apparatus capable of driving a plurality of motors.

2. Description of the Related Art

In JP-2006-226993A, there is described a device for detecting insulation deterioration in the windings of a motor connected to a motor driving apparatus comprising a power supply unit for producing DC power by rectifying three-phase AC power and smoothing it by a smoothing capacitor and a motor driving amplifier for inverting the DC power into AC power whose frequency is variable and for driving the motor. The device detects insulation deterioration by using an electric charge that remains in the smoothing capacitor for a finite period after the three-phase AC power has been shut off. That is, when detecting insulation deterioration, the three-phase AC power is shut off, and one end of the smoothing capacitor is connected to ground and the other end to the motor windings. Then, the discharge current flowing via the insulation resistance of the motor is compared with a reference value to detect the presence or absence of insulation deterioration.

The degree of motor insulation deterioration is judged with reference, for example, to 10 MΩ, and if the insulation resistance is smaller than this reference value, it is determined that the insulation has deteriorated. In the above device, the insulation deterioration is not judged by directly measuring the insulation resistance, but is judged by comparing the discharge current with the reference value, assuming that the voltage across the smoothing capacitor remains constant. However, the voltage across the smoothing capacitor varies according to the supply voltage, and changes due to the discharge occurring after the three-phase AC power has been shut off. Furthermore, the speed of change also varies according to the size of the load. It is therefore not possible to accurately detect insulation deterioration based on the assumption that the voltage across the smoothing capacitor remains constant, and a false warning of insulation deterioration may be output.

One possible method to address this problem would be to measure the voltage across the smoothing capacitor as well as the discharge current, to calculate the insulation resistance from them, and to compare it with the reference value.

However, in the case of a motor driving apparatus capable of simultaneously driving multiple motors, there arises the problem that such a measuring circuit has to be provided for each motor to be monitored and the configuration of the apparatus thus becomes redundant.

SUMMARY OF THE INVENTION

It is an object of the present invention to provide a motor insulation deterioration detection device that can accurately detect insulation deterioration in multiple motors by a simple circuit configuration.

The above object is achieved by a motor insulation deterioration detection device for detecting insulation deterioration in a plurality of motors connected to a motor driving apparatus comprising a converter unit having a rectifying circuit for rectifying AC power, a smoothing capacitor for smoothing an output of the rectifying circuit, and a plurality of inverters for inverting DC power output from the converter unit into AC power and for driving the plurality of motors, respectively, the detection device comprising: a first switch which is turned on to connect one end of the smoothing capacitor to ground when detecting insulation deterioration; a voltage detector which detects a voltage across the smoothing capacitor; a plurality of second switches which are turned on to connect the other end of the smoothing capacitor to windings of the plurality of motors, respectively, when detecting insulation deterioration; a plurality of current detectors which detect a discharge current of the smoothing capacitor that flows via insulation resistances of the plurality of motors, respectively, when the first switch and the plurality of second switches are turned on; and a plurality of insulation resistance calculators which calculate the insulation resistances of the plurality of motors, respectively, from the voltage detected by the voltage detector and the currents detected by the plurality of current detectors.

Preferably, the first switch and the voltage detector are provided in the converter unit, and the plurality of second switches, the plurality of current detectors, and the plurality of insulation resistance calculators are respectively provided in the plurality of inverter units, and preferably, the detection device further comprises communication means for transmitting the voltage value detected by the voltage detector to the plurality of insulation resistance calculators.

DESCRIPTION OF THE PREFERRED EMBODIMENTS

Figure 1:
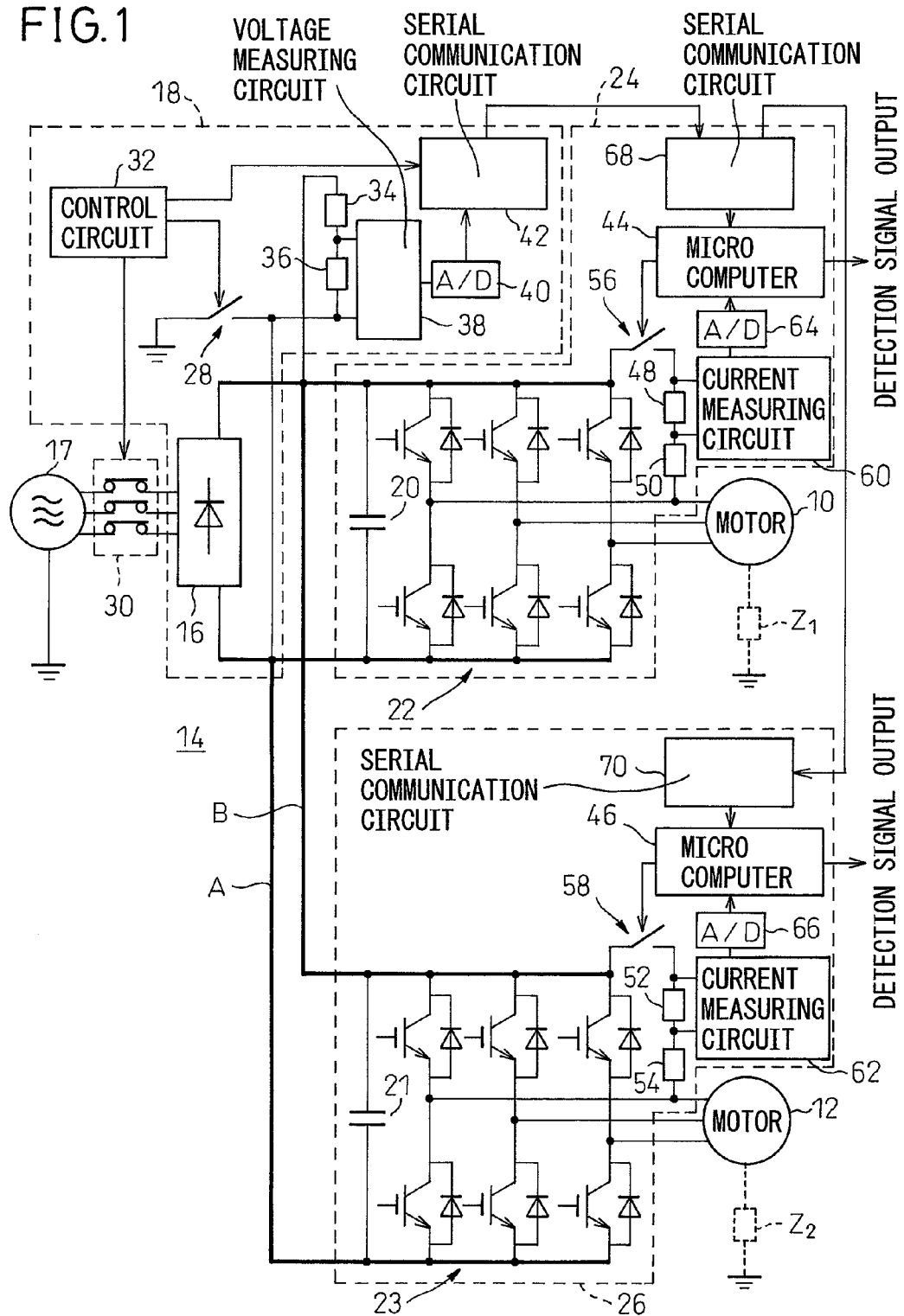
FIG. 1 is a block diagram showing one example of a motor driving apparatus having an insulation deterioration detection capability according to one embodiment of the present invention.

FIG. 1 shows one example of a motor driving apparatus having an insulation deterioration detection capability according to one embodiment of the present invention.

While FIG. 1 shows an example of the motor driving apparatus 14 that drives two motors 10 and 12, it will be appreciated that the number of motors is not limited to two. The motor driving apparatus 14 comprises a converter unit 18 and a plurality of (two) inverter units 24 and 26. The converter unit 18 includes a rectifier 16 and produces DC power by rectifying three-phase AC power 17. The inverter units 24 and 26 include smoothing capacitors 20, 21 and inverter circuits 22, 23, respectively, and drive the respective motors 10 and 12 by smoothing the DC power output from the converter unit 18 and inverting it into three-phase AC power whose frequency is variable.

The smoothing capacitors 20 and 21 provided in the respective inverter units 24 and 26 are connected in parallel so that they together function as one smoothing capacitor having the combined capacitance of the smoothing capacitors 20 and 21.

The converter unit 18 includes a switch 28 which, when turned on, connects one end of the rectifier 16, i.e., one end A of the smoothing capacitor 20, 21, to ground, and a control circuit 32 which turns off an electromagnetic contactor 30 and turns on the switch 28 when detecting insulation deterioration. The converter unit 18 further includes a voltage measuring circuit 38 which measures the voltage developed at the output end of the rectifier 16, more specifically, the voltage obtained by dividing between resistors 34 and 36 the voltage (DC link voltage (VDC)) developed across the smoothing capacitor 20, 21, and an A/D converter 40 which converts the measured voltage into a digital value. ON/OFF information of the switch 28 and the output of the A/D converter 40 are sent to the inverter units 24 and 26 in the form of serial signals.

The inverter unit 24 includes a switch 56 which, under instruction from a microcomputer 44, connects the other end B of the smoothing capacitor 20, 21 via resistors 48 and 50 to the output of the inverter circuit 22, i.e., the winding of the motor 10. Current flowing through the resistor 48 is measured by a current measuring circuit 60 by measuring the potential difference developed across the resistor 48. The current measured by the current measuring circuit 60 is converted by an A/D converter 64 into a digital value which is supplied to the microcomputer 44.

The inverter unit 26 includes a switch 58 which, under instruction from a microcomputer 46, connects the other end B of the smoothing capacitor 20, 21 via resistors 52 and 54 to the output of the inverter circuit 23, i.e., the winding of the motor 12. Current flowing through the resistor 52 is measured by a current measuring circuit 62 by measuring the potential difference developed across the resistor 52. The current measured by the current measuring circuit 62 is converted by an A/D converter 66 into a digital value which is supplied to the microcomputer 46.

When detecting insulation deterioration, the control circuit 32 in the converter unit 18 first turns off the electromagnetic contactor 30 to shut off the power being supplied from the three-phase AC power supply 17, and then turns on the switch 28 to connect the one end A of the smoothing capacitor 20, 21 to ground. The ON timing of the switch 28 and the result of the measurement of the DC link voltage by the voltage measuring circuit 38 are sent via a serial communication circuit 42 to serial communication circuits 24 and 26 in the respective inverter units 24 and 26 in the form of serial signals.

Upon receiving the signal indicating the ON state of the switch 28 from the converter unit 18, the microcomputer 44 in the inverter unit 24 turns on the switch 56 to connect the other end B of the smoothing capacitors 20, 21 to the winding of the motor 10. Thereupon, the discharge current from the smoothing capacitor 20, 21 flows via the ground resistance $Z_1$ of the motor 10, and this current is measured by the current measuring circuit 60.

The microcomputer 44 calculates the value of the insulation resistance $Z_1$ from the DC link voltage value received from the converter unit 18 and the current value measured by the current measuring circuit 60, compares it with a predetermined reference value, and outputs the result as an insulation resistance deterioration detection signal.

Upon receiving the signal indicating the ON state of the switch 28 from the converter unit 18, the microcomputer 46 in the inverter unit 26 turns on the switch 58 to connect the other end B of the smoothing capacitor 20, 21 to the winding of the motor 12. Thereupon, the discharge current from the smoothing capacitor 20, 21 flows via the ground resistance $Z_2$ of the motor 12, and this current is measured by the current measuring circuit 62.

The microcomputer 46 calculates the value of the insulation resistance $Z_2$ from the DC link voltage value received from the converter unit 18 and the current value measured by the current measuring circuit 62, compares it with a predetermined reference value, and outputs the result as an insulation resistance deterioration detection signal.

The communication means for connecting the converter unit 18 with the inverter units 24 and 26, such as described above, may be implemented as parallel communication instead of serial communication, provided that it is configured to be able to achieve the above function.

By pre-designing the above mechanism into the converter unit 18 and inverter units 24 and 26, it becomes possible to detect insulation resistance deterioration in a plurality of motors by using a minimum circuit configuration and minimum circuitry.

In particular, in the case of a motor driving apparatus comprising the inverter and converter units in separate housings, various combinations are possible for the number of inverter units to be connected to one converter unit and the number of motors to be connected to it via the inverter units, but if the mechanism for transmitting the voltage information and the switch ON timing notification signal from the converter unit to all the inverter units, such as described above, is incorporated into the communication means for communicating between the converter unit and the inverter units, then whatever combination is chosen for the number of inverter units and the number of motors to be connected to the converter unit, insulation resistance deterioration in any of the motors connected to the same converter unit via the plurality of inverter units can be detected without changing any connection or making any special setting for the motor insulation resistance deterioration detection function.

Furthermore, in the present invention, since the switch ON action and voltage information from the one converter unit is shared by the plurality of inverter units so that all the inverter units perform measurements for the detection of insulation resistance deterioration simultaneously with the same timing, the time required to complete the measurements is the same as the measurement time required for one motor regardless of the number of motors, and the measurement time can thus be shortened. Further, if the number of motors is increased or reduced, such changes can be accommodated without changing any connection or making any special setting.

Figure 2:
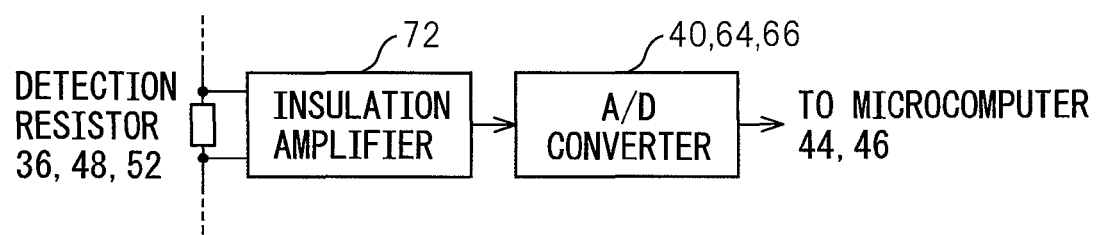
FIG. 2 is a diagram showing a specific configuration example of a voltage/current measuring circuit.

FIG. 2 shows a specific configuration example of the measuring circuits 38, 60, and 62 in FIG. 1. Each circuit measures the voltage across the detection resistor, and since the detection resistor 36, 48, 52 is connected to the primary circuit, the detected voltage is converted by an insulation amplifier 72 into a secondary potential which is then input to the A/D converter 40, 64, 66 for conversion into digital data.

The voltage or current converted into the digital data by the A/D converter 40, 64, 66 is eventually input into the microcomputer 44, 46 for processing. For the voltage, the DC link voltage (VDC) is calculated from the relationship of the voltage dividing ratio between the detection resistor 36 and the resistor 34 connected in series to it. For the current, first the voltage across the detection resistor 48, 52 is detected, and then the current flowing through the detection resistor 48, 52 is calculated from the detected voltage value and the value of the detection resistor 48, 52.

The invention claimed is:

1. A motor insulation deterioration detection device for detecting insulation deterioration in a plurality of motors connected to a motor driving apparatus comprising a converter unit having a rectifying circuit for rectifying AC power, a smoothing capacitor for smoothing an output of said rectifying circuit, and a plurality of inverters for inverting DC power output from said converter unit into AC power and for driving said plurality of motors, respectively, said detection device comprising:

a single first switch which is turned on to connect one end of said smoothing capacitor to ground when detecting insulation deterioration;

a single voltage detector which detects a voltage across said smoothing capacitor;

a plurality of second switches which are turned on to connect the other end of said smoothing capacitor to windings of said plurality of motors, respectively, when detecting insulation deterioration;

a plurality of current detectors which detect a discharge current of said smoothing capacitor that flows via insulation resistances of said plurality of motors, respectively, when said first switch and said plurality of second switches are turned on; and a plurality of insulation resistance calculators which calculate the insulation resistances of said plurality of motors, respectively, from the voltage detected by said voltage detector and the currents detected by said plurality of current detectors, wherein said single first switch and said single voltage detector are provided in said converter unit, and said plurality of second switches, said plurality of current detectors, and said plurality of insulation resistance calculators are respectively provided in said plurality of inverter units, wherein said detection device further comprises communication means for transmitting the voltage value detected by said single voltage detector and a signal notifying the timing when said single first switch is switched ON from said converter unit to said plurality of inverter units, wherein connection by said second switches, current detection by the current detectors, and calculation of the insulation resistances by the insulation resistance calculators are performed in the respective inverter units simultaneously with the same timing.

* * * * *